(12) United States Patent
Sanchez

(10) Patent No.: US 6,494,370 B1
(45) Date of Patent: Dec. 17, 2002

(54) ELECTRO-OPTIC SYSTEM CONTROLLER AND METHOD OF OPERATION

(75) Inventor: Jorge Sanchez, Poway, CA (US)

(73) Assignee: CEYX Technologies, San Diego, CA (US)

( * ) Notice: Subject to any disclaimer, the term of this patent is extended or adjusted under 35 U.S.C. 154(b) by 0 days.

(21) Appl. No.: 09/517,375

(22) Filed: Mar. 2, 2000

Related U.S. Application Data

(63) Continuation-in-part of application No. 09/472,709, filed on Dec. 24, 1999, which is a continuation-in-part of application No. 08/988,865, filed on Dec. 11, 1997, now Pat. No. 6,028,423.
(60) Provisional application No. 60/173,056, filed on Dec. 24, 1999.

(51) Int. Cl.$^7$ .................................................. G06K 7/10
(52) U.S. Cl. ...................................... 235/454; 235/455
(58) Field of Search ................................. 235/454, 492, 235/462.01; 324/96, 750

(56) References Cited

U.S. PATENT DOCUMENTS

| | | | |
|---|---|---|---|
| 5,019,769 A | | 5/1991 | Levinson |
| 5,113,131 A | * | 5/1992 | Cooper et al. ................ 324/96 |
| 5,844,928 A | | 12/1998 | Shastri et al. |
| 6,028,423 A | * | 2/2000 | Sanchez ....................... 324/96 |
| 6,057,678 A | * | 5/2000 | Tagiri et al. .................. 324/96 |
| 6,145,743 A | * | 11/2000 | Dvorkis et al. ........ 235/462.01 |

* cited by examiner

*Primary Examiner*—Michael G. Lee
*Assistant Examiner*—Ahshik Kim
(74) *Attorney, Agent, or Firm*—Brown, Martin, Haller & McClain

(57) ABSTRACT

A method for calibrating a laser module system includes the processes of connecting testing equipment used for laser calibration to the laser output; setting preamplifier gain to nominal; connecting input of preamplifier to ground; turning off the DC bias for laser; canceling the offset voltage of the preamplifier; recording the monitoring photodiode dark current; incrementing the DC bias to the laser; reading $P_L$; computing $dP_L/dI_L$; setting the DC bias to threshold; recording $P_{LTH}$; recording the photodiode current $I_{PT}$; recording the temperature of laser module; connecting the preamplifier to provide a $V_{REF}$ input signal to the laser module input increment preamplifier gain $G_1$ while reading power output $P_L$ with instrument; determining the preamplifier gain $G_F$ needed to obtain full scale output of laser power ($P_{LM}$); determining the corresponding photodiode current for above condition $I_{PM}$; calculating the effective responsivity $R_{eff}$ of the module containing the laser and the photodiode; and storing the effective module responsivity $R_{eff}$ in memory.

1 Claim, 12 Drawing Sheets

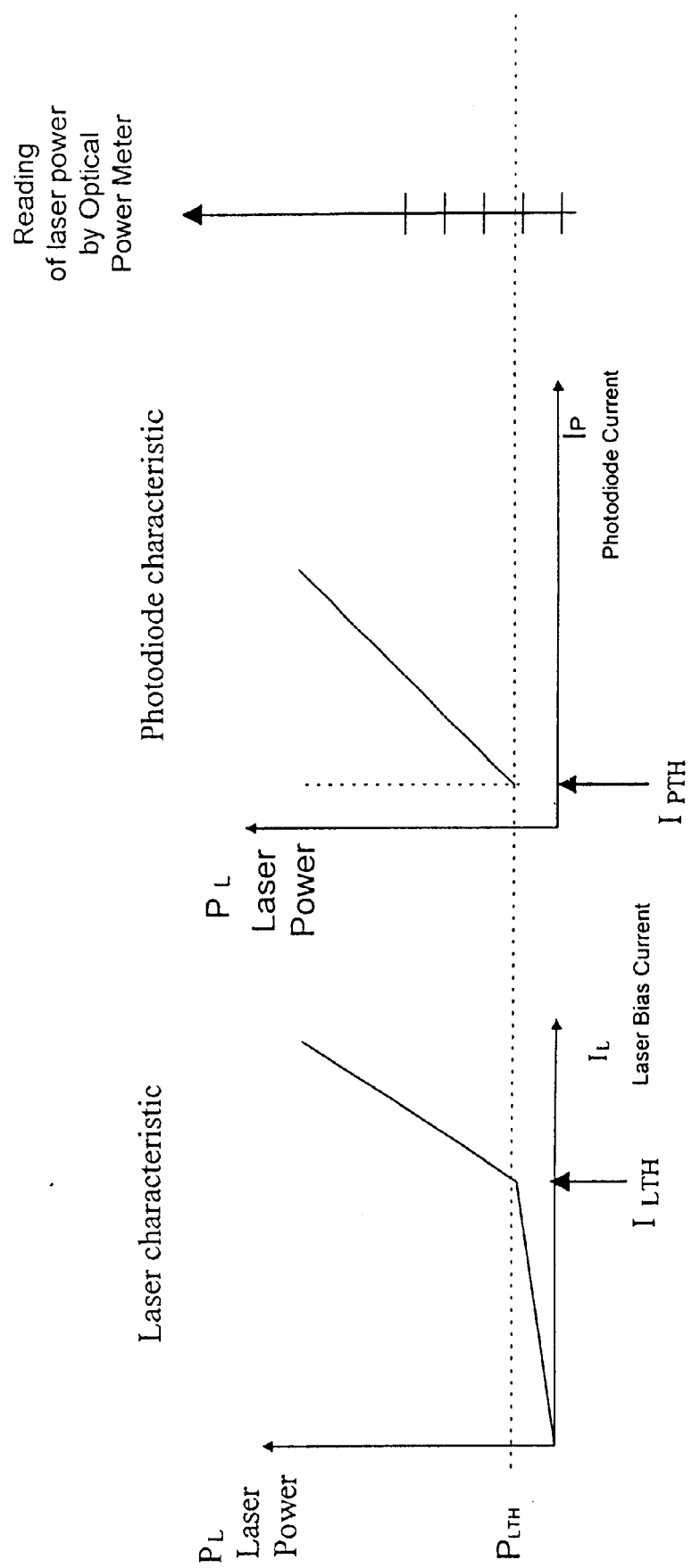

Drive Controller Factory Calibration Process

Power Up Calibration and Initialization

ELECTRO-OPTIC SYSTEM CONTROLLER AND METHOD OF OPERATION

CROSS-REFERENCES TO RELATED APPLICATIONS

This application is a continuation-in-part of U.S. patent application Ser. No. 09/472,709 filed Dec. 24, 1999, which is a continuation-in-part of U.S. patent application Ser. No. 08/988,865 filed on Dec. 11, 1997, now U.S. Pat. No. 6,028,423. This application claims the benefit of priority under 35 U.S.C. §119(e) to U.S. Provisional Application Ser. No. 60/173,056 filed on Dec. 24, 1999.

U.S. patent application Ser. No. 08/988,865 filed on Dec. 11, 1997, now U.S. Pat. No. 6,028,423; U.S. patent application Ser. No. 09/472,709 filed Dec. 24, 1999; and U.S. Provisional Application Ser. No. 60/173,056 filed Dec. 24, 1999, are incorporated by reference in their entirety for all purposes.

BACKGROUND

The present invention relates to a logic system based controller and more specifically a controller that utilizes state machines, logic and/or a microprocessor for an electro-optic system.

Electro-optic systems are known in the art for providing an interface between electronic and optically-based systems. Such electro-optic systems are used in a variety of applications including telecommunications, remote sensing, medical devices, and in other fields as well.

FIG. 1A illustrates a conventional electro-optic system 100 for use with one of the aforementioned systems. The electro-optic system 100 includes a laser 110 and an analog bias controller 120. Typically, an electronic system produces a modulating signal which is combined with a laser bias current $I_{dc}$. The combined signal is injected into the laser which produces a modulating optical output signal $P_o$, typically an intensity modulated signal in which the light intensity varies as a function of the amplitude of the modulating signal.

In analog systems, the bias current Idc is selected such that it biases the laser at an operating point where the laser output power $P_o$ exhibits a linear relationship to the input bias $I_{dc}$ (herein referred to as the laser's transfer function.). The modulating signal varies the bias point above and below this operating point thereby producing a corresponding change in the intensity of the output power of the laser 110.

The laser 110 will typically includes a monitoring photodiode (not shown) either separate or integrated into the same package with the laser. The monitoring photodiode produces a photodiode current Ipd indicative of the laser output power $P_o$. The photodiode current $I_{pd}$ is supplied to an analog bias controller 120 which includes circuitry designed to measure the $I_{pd}$ photodiode current and to return it to a predefined current level.

FIG. 1B illustrates a graph showing three transfer functions of a laser at three operating temperatures. The graph illustrates laser output power along the y-axis and laser bias current $I_{dc}$ along the x-axis. The first trace 152 illustrates the laser's transfer function at a first operating temperature $T_1$. The second and third traces 154 and 156 similarly illustrate the laser's transfer function at a second and a third operating temperature, $T_2$ and $T_3$ respectively.

Each of the transfer functions 152, 154 and 156 also include a corresponding threshold operating point $I_{th1}$, $I_{th2}$, and $I_{th3}$ respectively. The threshold operating points indicate the laser bias current level at which the laser produces appreciable output power. As can be seen, the laser's threshold operating point varies greatly with operating temperature; a change in the operating temperature of the laser shifts the transfer function laterally along the x-axis.

The shift can produce a significant change in the laser output power. For instance, if a laser bias current Idc is selected to bias the laser at operating point $I_{q1}$ 162 in the center of the linear region of the transfer function, the laser will operate as intended to produce a substantially linearly varying output power when excited by the modulating signal. If the operating temperature of the laser operating temperature changes to $T_2$, the laser output power for the same bias current $I_{q1}$, drops significantly as shown by operating point 163. In this case, the linear operating region of the laser and electro-optic system 100 is limited to the linear region below operating point 163. The analog bias controller 120 contains circuits to compensate for change but with a limited degree of accuracy. The analog controller also requires manual adjustments and has limited control capabilities.

Therefore what is needed is a new system and method for controlling a electro-optic system over varying temperatures of operation.

SUMMARY OF THE INVENTION

The present invention provides a new system and method for controlling a electro-optic system by which the threshold operating point of the system gain and other parameters can be accurately established and the laser transfer function controlled over a variety of different temperatures. The present invention further provides a system and method for enabling a link characterization process to be performed between two electro-optic systems.

The electro-optic drive controller of the present invention includes a preamplifier output coupled to a laser module system input. The laser module system includes a laser bias input, a laser output, a temperature sensor output, and a monitoring photodiode sensor output. In one embodiment, the present invention provides a method for calibrating the laser module system, including the processes of connecting testing equipment used for laser calibration to the laser output; setting preamplifier gain to nominal; connecting input of preamplifier to ground; turning off the DC bias for laser; canceling the offset voltage of the preamplifier; recording the monitoring photodiode dark current; incrementing the DC bias to the laser; reading $P_L$; computing $dP_L/dI_L$; setting the DC bias to threshold; recording $P_{LTH}$; recording the photodiode current $I_{PT}$; recording the temperature of laser module; connecting the preamplifier to provide a $V_{REF}$ input signal to the laser module input increment preamplifier gain $G_1$ while reading power output $P_L$ with instrument; determining the preamplifier gain $G_F$ needed to obtain full scale output of laser power ($P_{LM}$); determining the corresponding photodiode current for above condition $I_{PM}$; calculating the effective responsivity $R_{eff}$ of the module containing the laser and the photodiode; and storing the effective module responsivity $R_{eff}$ in memory.

The nature and advantages of the present invention will be better understood with reference to the following drawings and detailed description.

BRIEF DESCRIPTION OF THE DRAWINGS

FIGS. 6A and 6B illustrate the laser and photodiode characteristics, respectively, measured during the calibration process in accordance with one embodiment of the present invention.

DESCRIPTION OF SPECIFIC EMBODIMENTS

I. General Overview

Figure 1A:
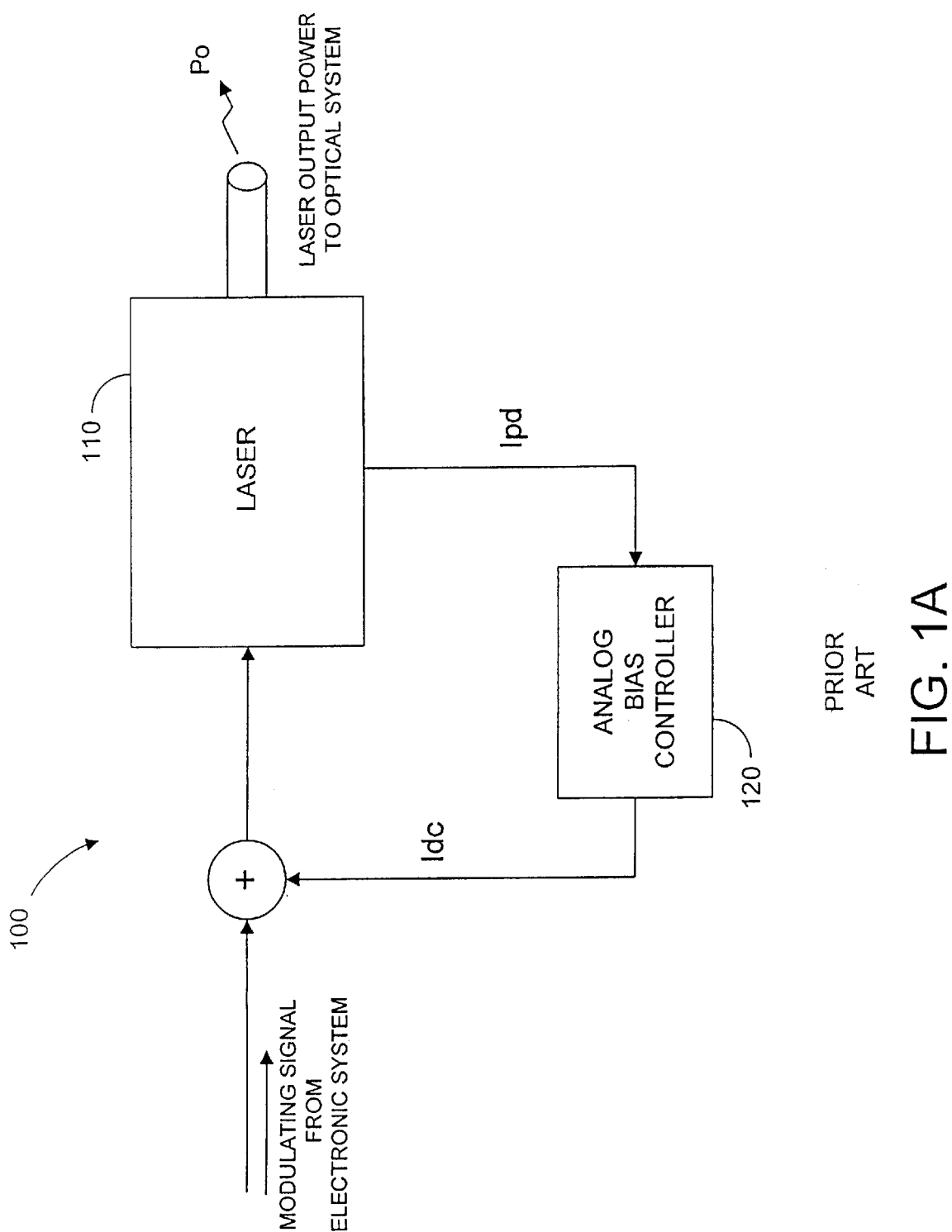
FIG. 1A illustrates a conventional electro-optic communication system.
Figure 1B:
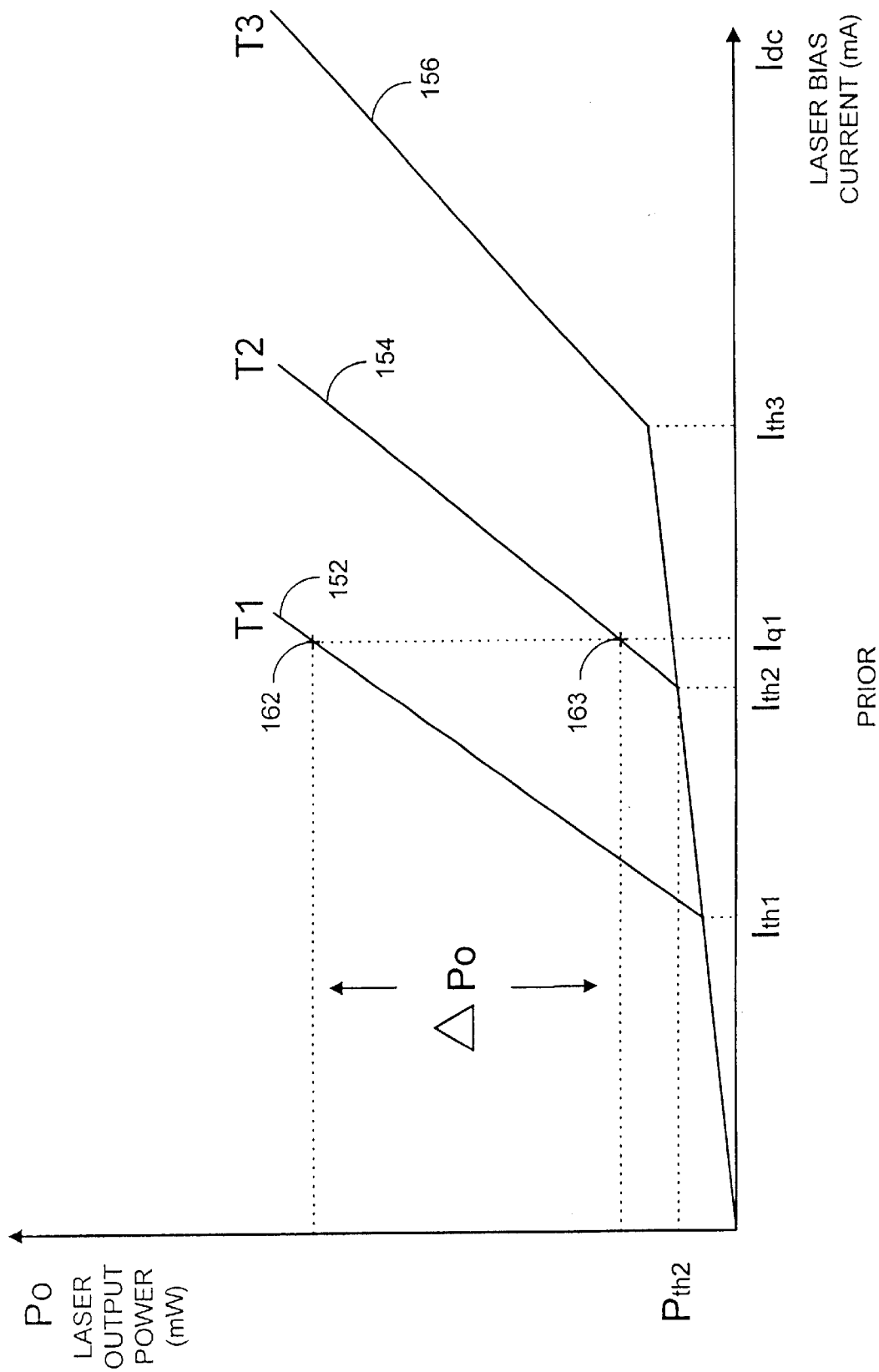
FIG. 1B illustrates a transfer function of the laser shown in FIG. 1A.
Figure 2A:
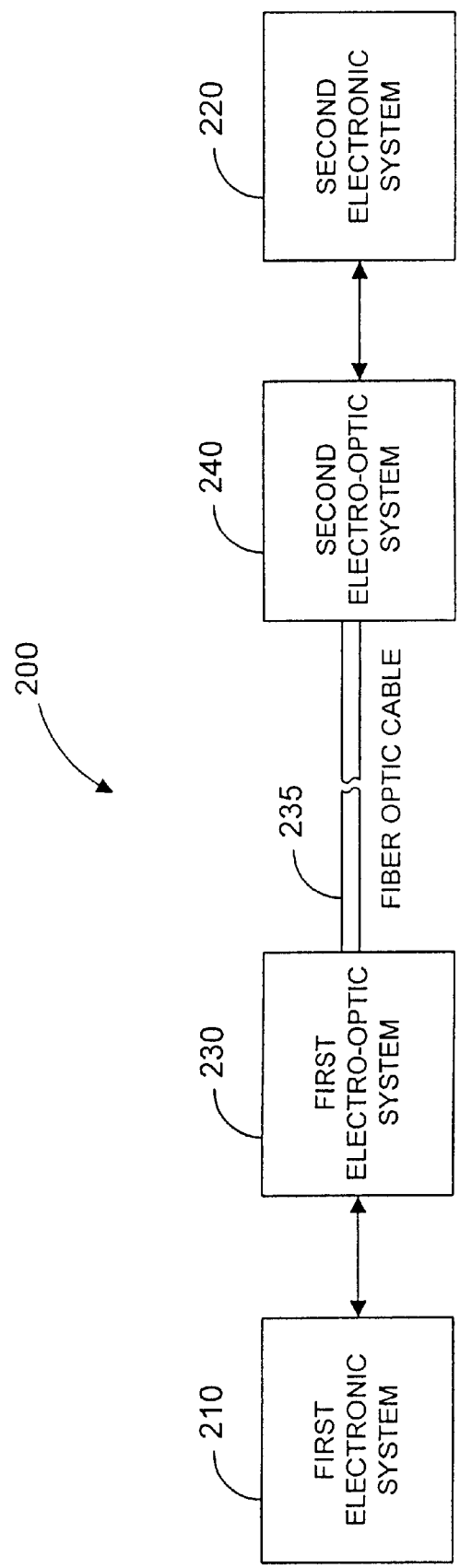
FIG. 2A illustrates an electro-optic communication system representing one embodiment in which the present invention may be utilized.

FIG. 2A illustrates an electro-optic communication system 200 representing one embodiment in which the present invention may be utilized. In this embodiment, the system 200 includes first and a second electronic systems 210 and 220, first and second electro-optic systems 230 and 240, and an optical channel 235, a fiber optic cable in the illustrated embodiment. During operation, the first electronic system 210 generates an electronic signal for transmission to the second electronic system 220. The first electro-optic system 230 receives the electronic signal, converts it to an optical signal, and transmits the optical signal over the fiber optic cable 235 to the second electro-optic system 240. The second electro-optic system receives the optical signal, converts it back to substantially the original. electronic signal, and provides it to the second electronic system 220. The controller of the present invention may be implemented in other electro-optic systems outside of the communications field as well.

Figure 2B:
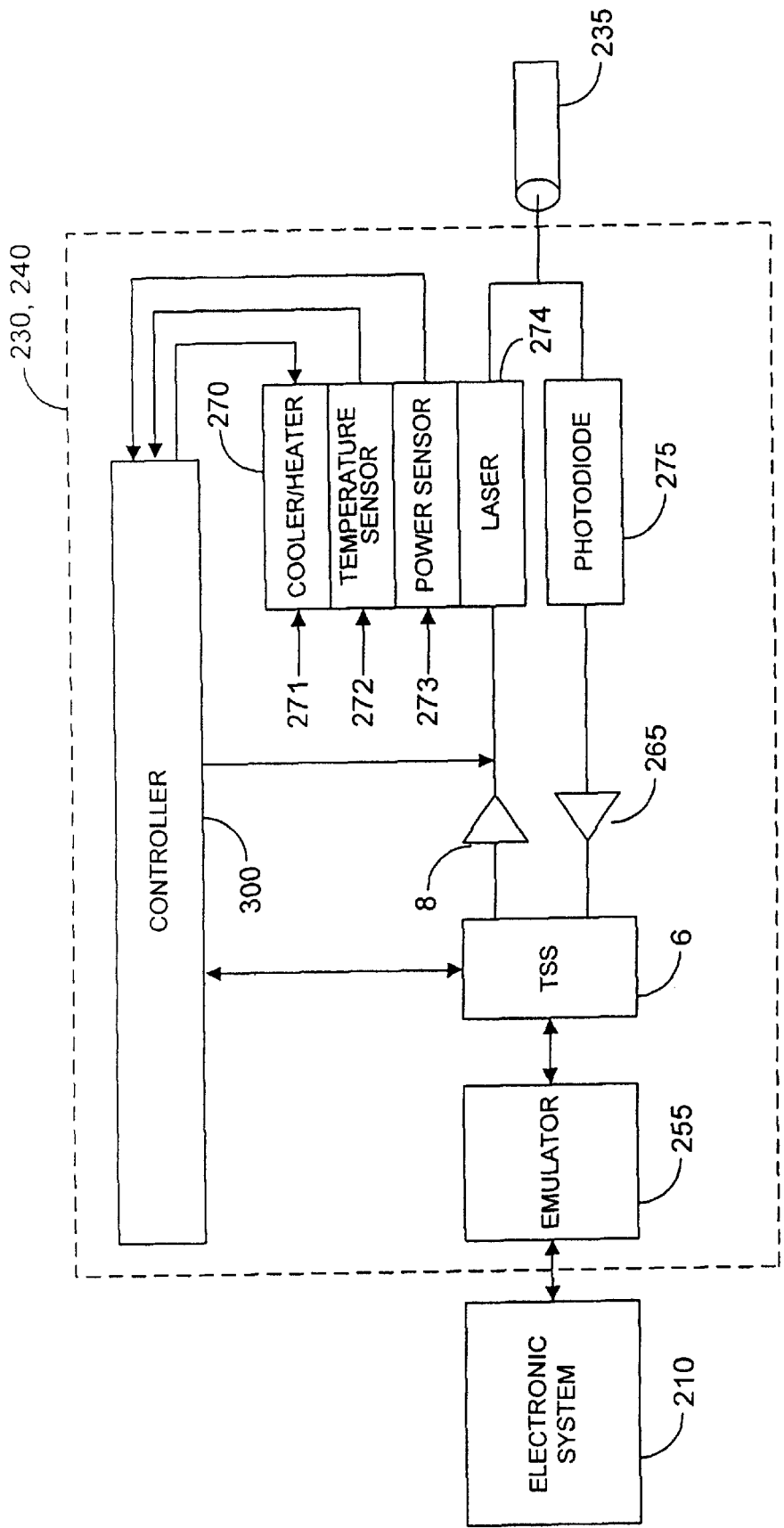
FIG. 2B illustrates one embodiment of the electro-optic system illustrated in FIG. 2A in accordance with the present invention.

FIG. 2B illustrates one embodiment of the electro-optic systems 230, 240 illustrated in FIG. 2A. Each system 230, 240 includes an emulator circuit 255 coupled to a test system switch 6. The test system switch 6 has an output coupled to a laser driver amplifier 8 and an input coupled to a photodetector amplifier 265. The laser driver/amplifier 8 is coupled to a laser module 270 which emits the optical signal onto the optical channel, a fiber optic cable 235 in the illustrated embodiment. The laser module 270 may include a cooling/heating element 271, a operating temperature sensor 272, a laser output power sensor 273, and a laser 274, which may be a laser diode or a light emitting diode (LED). The photodetector amplifier 265 has an input coupled to a photodetector circuit 275 configured to receive an optical signal transmitted to the system 230, 240 along the fiber optic cable 235.

The system 230, 240 further includes a controller 300 coupled to the test system switch 6, the laser driver/amplifier 8, and to the laser module 270 and is operable to manage the functions of these components during operation. The controller may additionally be coupled to the photodetector 275, the photodetector amplifier 265, the emulator 255, or other system components in order to control their operation as well.

II. Controller Architecture

Figure 3:
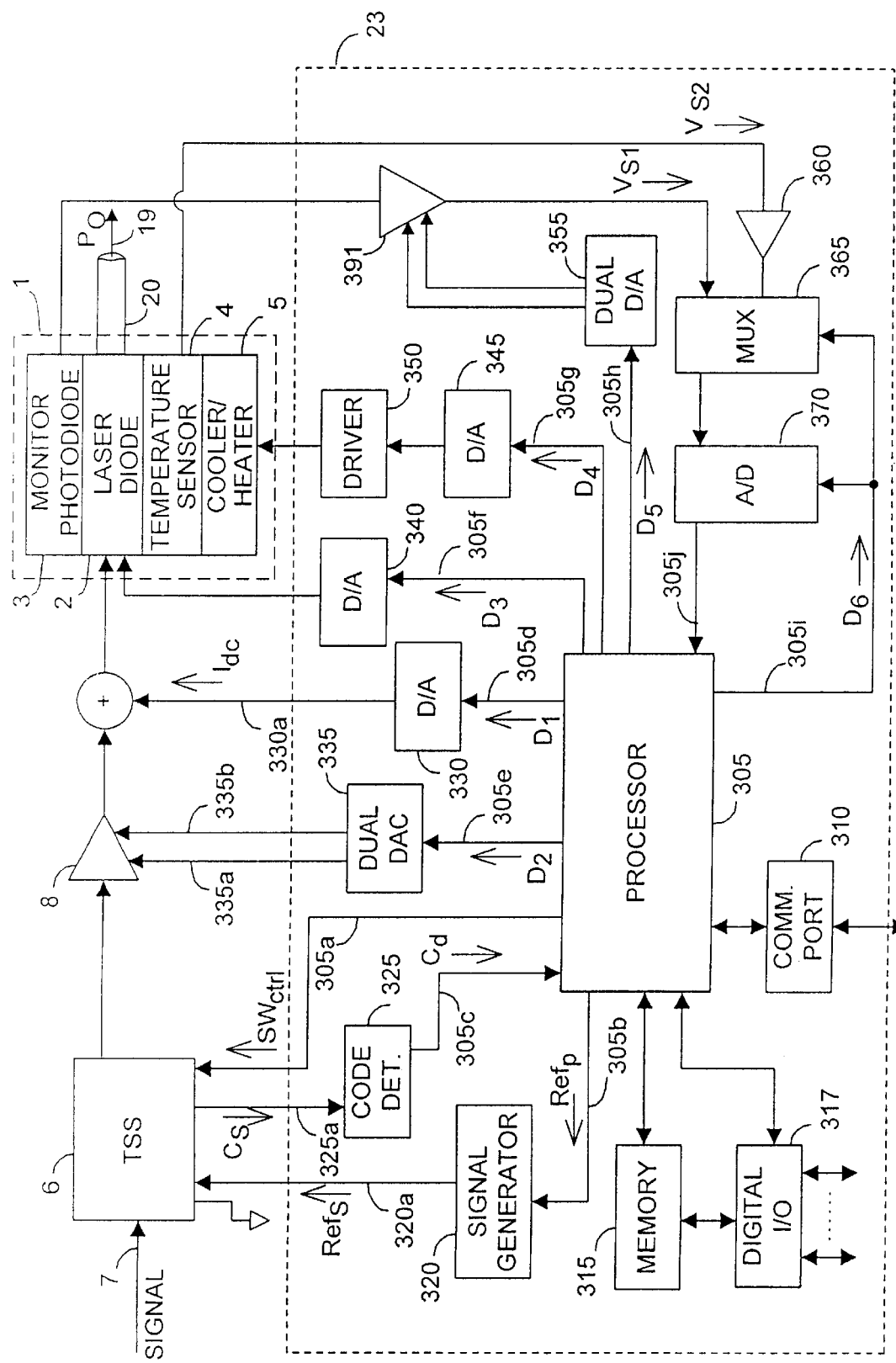
FIG. 3 illustrates one embodiment of the electro-optic system controller in accordance with the present invention.

FIG. 3 illustrates one embodiment of the controller 300 in accordance with the present invention. As illustrated, the controller 300 includes a processor 305 which is preferably programmable using a local or remotely located host input/output (I/O) device 390 communicated via an I/O communication port 310. Alternatively or in addition, the processor 305 may store and/or retrieve programming signals to/from a memory storage device 315, an integrally formed erasable read only memory (EAROM) in one embodiment. Alternatively, the memory storage device 315 may be a local or remotely located RAM, ROM, PROM, storage device, a fixed or removable hard, floppy, or CD-ROM disc, or similar medium which is readable and/or recordable via a corresponding drive unit (not shown). Other memory storage units are of course possible and compatible with the present invention. A digital input/output interface 317 may be used to generate digital control signals for transmission to other components within the electro-optic system 230.

The processor includes one or more control lines 305a coupled to the test system switch 6 to communicate a switch control signal $SW_{ctrl}$ for controlling the switch's state. In a preferred embodiment, the switch control signals are CMOS logic level signals having voltages in the range of +/−5 VDC in a typical embodiment. The control line 305a may further include one or more power lines (typically +/−5V) and a ground line to provide these signals to the switch 6.

The controller 300 further includes a signal generator 320. The signal generator 320 receives a processor reference signal $Ref_p$ and in response produces a signal generator reference signal $Ref_s$. The signal generator reference signal $Ref_s$ is supplied to the test system switch 6 via line 320a in order to perform a transmitter calibration or a link characterization process, further described in applicant's co-pending patent application referred to above entitled "Electro-Optic Interface System and Method of Operation." The processor and/or signal generator reference signal(s) $Ref_p$ and $Ref_s$ may be a dc voltage or an ac signal, in either digital or analog form. In a specific embodiment, the processor reference signal $Ref_p$ is a stream of bits representing a digital word and the signal generator reference signal $Ref_s$ is an analog waveform. The signal generator 320 may include modulation, multiplexing, and/or conditioning circuitry, such as amplifiers, filters, and the like. In an alternative embodiment, the signal generator 320 is a digital-to-analog converter (DAC) configured to receive a digital signal $Ref_p$ and to generate, in response, an analog reference signal $Ref_s$. The controller 305 may further include a signal receiver (not shown) coupled to the test system switch 6 and configured to receive a returned reference signal which is communicated from the second electro-optic system 240 during the link characterization process, further described in applicant's co-pending patent application "Electro-Optic Interface System and Method of Operation." The receiver may be configured to receive and process analog and/or digital signals and include may include modulation, multiplexing, and/or conditioning circuitry, such as amplifiers, filters, digital-to-analog converters, analog-to-digital converters and the like.

The processor 305 and test system switch 6 are further coupled together by means of a code detector 325 operable to identify the reception of an encoded signal received by the system 230, 240. The code detector 325 is coupled to the test system switch 6 via a line 325a to receive a coded signal $C_s$. In a specific embodiment, the coded signal $C_s$ is a binary word of a predefined length indicative that a link characterization process is underway in which the existence and quality of the communication link is determined. The link characterization process is further described in applicant's co-pending patent application entitled "Electro-Optic Interface System and Method of Operation."

In response to the coded signal $C_s$, the code detector 325 outputs coded data $C_d$ to the processor 305 via lines 305c. The coded signal $C_s$ and coded data $C_d$ may be a dc voltage or an ac signal, in either analog or digital form.

In a specific embodiment, the code detector 325 is a digital comparator having two registers. One register is loaded with a predetermined pattern of binary bits containing the code. The second register is a universal asynchronous receiver transmitter (UART) register in which the incoming bits are received and shifted. The digital comparator includes a second stage in which each bit in the first and second registers are compared. If all of the bits in the first and second registers match, the code signal $C_s$ is deemed received and the coded data $C_d$ (a high logic level in one embodiment) is output to the processor. Some or all of the described functions may reside within the processor 305 as hardware, software, and/or firmware.

As appreciable to those skilled in the art, signal lines 305a, 320a and 325a ay comprise an integrated bus line along with the aforementioned control and data signals are communicated. In addition, power and ground potentials, as well as other signals may be communicated in such a bus line.

In a specific embodiment, the controller 300 includes a pulse width modulator with a filter and a current source or digital-to-analog converter (DAC) 330 coupled to the processor 305 via line 305d. In response to a supplied digital signal $D_1$, the DAC 330 generates a laser biasing current $I_{dc}$. During operation, the processor 305 outputs digital signals $D_1$ having a multitude of different values, depending upon the desired level of laser output power. The processor of the present invention also generates a multitude of different digital signals to calibrate the laser 274, the process of which is further described below.

The controller 300 also includes a dual digital-to analog converter (DAC) 335 for controlling the output signal level and/or the gain of a laser driver/amplifier 8. The dual DAC 335 is coupled to the processor 305 via line 305e and receives a digital control signal $D_2$ to set the output power level and the signal gain of the laser driver/amplifier 8. The value of the digital control signal $D_2$ may be responsive to operating parameters such as output signal level of the test system switch 6, input handling of the laser 274, and/or sensed laser output power. Other operating conditions may also be included in determining the value of $D_2$.

In an embodiment in which the laser 274 is tunable, the controller 300 may further include a DAC 340 for controlling the wavelength of the laser 274. The DAC 340 has an input which is coupled to the processor 305 via line 305f and receives a digital control signal $D_3$ corresponding to the desired laser wavelength. The DAC 340 generates an analog signal which is supplied to a wavelength tuning input of the laser 274. The laser 274 may vary the emitted wavelength in response to a variety of signal characteristics, for instance the amplitude, phase, or frequency of the signal output from DAC 340 may be used in conjunction with other electro-optic devices to tune the laser. Those of skill in the art will appreciate that circuits other than a DAC circuit may be used to tune the wavelength of the laser 274.

The controller 300 may further include a DAC 345 and driver 350 configured to control the operation of a heating and/or cooling element 271, which may be integrally formed with the laser 274. The DAC 345 has an input which is coupled to the processor 305 via line 305g and receives a digital control signal $D_4$ corresponding to the desired laser temperature setting. The value of the digital control signal $D_4$ may be responsive to operating parameters such as the sensed operating temperature which indicates that the laser is operating outside of a predefined temperature window or alternatively, or in addition, that the laser has undergone a relative change in operating temperature beyond a predefined window. Other operating conditions may also be included in determining the value of $D_4$.

The controller 300 may further include a dual DAC 355 operable to modify the gain and offset of the amplifier 391. The DAC 355 is used to calibrate the photodiode's characteristic response to the laser light detected. A calibrated voltage $V_{s1}$ is provided at the output of the amplifier 391. The circuit used to obtain a programmable amplifier is similar to the circuit used to obtain a programmable amplifier for the signal amplifier.

The controller 300 further includes sensing amplifiers 360, a multiplexer 365, and an ADC 370 coupled to the processor 305. The sensing amplifiers 360 are used to amplify the monitoring photodiode voltage $V_{s1}$ described above, and a laser temperature voltage $V_{s2}$ which indicates the operating temperature of the laser 274. In one embodiment, one or both of the voltages $V_{s1}$ and/or $V_{s2}$ may be provided as outputs of the laser module 270. Other sensing amplifiers (not shown) may be used to sense the laser current and voltage to determine power.

The outputs of the sensing amplifiers 360 are coupled to the multiplexer 365. Responsive to a digital control signal $D_6$ transmitted along control line 305i, the multiplexer selects between one of the sensing amplifier outputs as an input. The output of the multiplexer 365 is coupled to an ADC 370 which converts the selected analog voltage $V_{s1}$ or $V_{s2}$ to a digital signal. The digital signal is subsequently supplied to the processor 305 via line 305j. In this manner, the processor monitors the output power and operating temperature of the laser 274. Those of skill in the art will appreciated that the same or similar arrangement may be used to monitor other operating parameters of the laser 274, laser module 270, laser driver/amplifier 8, test system switch 6, or other components of the electro-optic system 230, 240.

Responsive to the monitored output power and/or operating temperature, the processor 305 adjusts the value of the digital signal $D_1$ and D2 of the dual D/A 335. In one embodiment in which analog signals modulate the laser input, the processor 305 senses the operating temperature of the laser. As is further described below, the laser undergoes a calibration routine to determine the laser transfer function and optimum bias condition for laser operation at one or more laser operating temperatures. The processor 305 retrieves from memory 315 parameters to determine the optimum laser operating currents and outputs a digital signal corresponding thereto to the PWM or DAC 330 and to the DAC 335. In a second embodiment in which digital signals modulate the laser input, the processor 305 senses the operating temperature and performs a similar compensation described above.

The processor in the driver controller may include state machines, logic and a microcontroller. Depending upon the application, one or more of these logic circuits can be utilized and can be part of an ASIC.

The controller 300 has been described in terms of the components and interconnections for controlling a single electro-optic system 230. Alternatively, in a larger electro-optic system 230, 240 such as a wavelength division multiplexing (WDM) system in which the system 230, 240 includes multiple channels, each channel having the aforementioned components 250–275, the controller 300 may operate to control the operations of some or all of the components within each channel. The architecture of an exemplary WDM electro-optic system 230 is further described in applicant's co-pending patent application "Electro-Optic Interface System and Method of Operation."

III. Controller Operation

Figure 9:
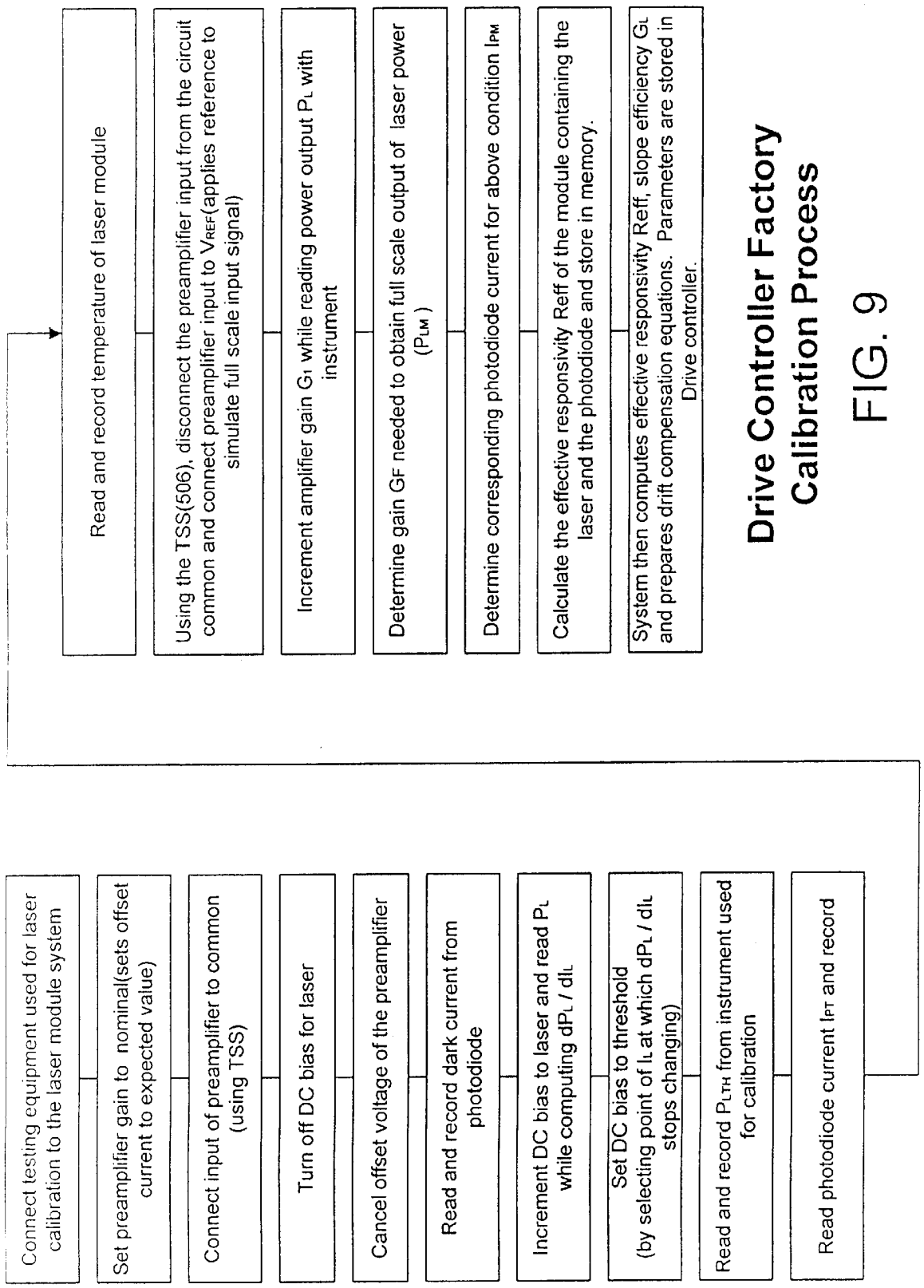
FIG. 9 illustrates one embodiment of the drive controller factory calibration process in accordance with the present invention.

FIG. 9 illustrates one embodiment of the drive controller factory calibration process in accordance with the present invention. The process is as follows:

1. Connect testing equipment used for laser calibration to the laser module system
2. Set preamplifier gain to nominal(sets offset current to expected value)
3. Connect input of preamplifier to common (using TSS)
4. Turn off DC bias for laser
5. Cancel the offset voltage of the preamplifier
6. Read and record dark current from photodiode
7. Increment DC bias to laser and read $P_L$ while computing $dP_L/dI_L$
8. Set DC bias to threshold(by selecting point of $I_L$ at which $dP_L/dI_L$ stops changing)
9. Read and record $P_{LTH}$ from instrument used for calibration
10. Read photodiode current $I_{PT}$ and record
11. Read and record temperature of laser module
12. Using the TSS(506), disconnect the preamplifier input from the circuit common and connect preamplifier input to $V_{REF}$(applies reference to simulate full scale input signal)
13. Increment amplifier gain $G_I$ while reading power output $P_L$ with instrument
14. Determine gain $G_F$ needed to obtain full scale output of laser power ($P_{LM}$)
15. Determine corresponding photodiode current for above condition $I_{PM}$
16. Calculate the effective responsivity $R_{eff}$ of the module containing the laser and the photodiode and store in memory.
17. System then computes effective responsivity $R_{eff}$, slope efficiency $G_L$ and prepares drift compensation equations (see below). Parameters are stored in Drive controller.

Detailed Description of Method for Factory Calibration Process

Figure 4:
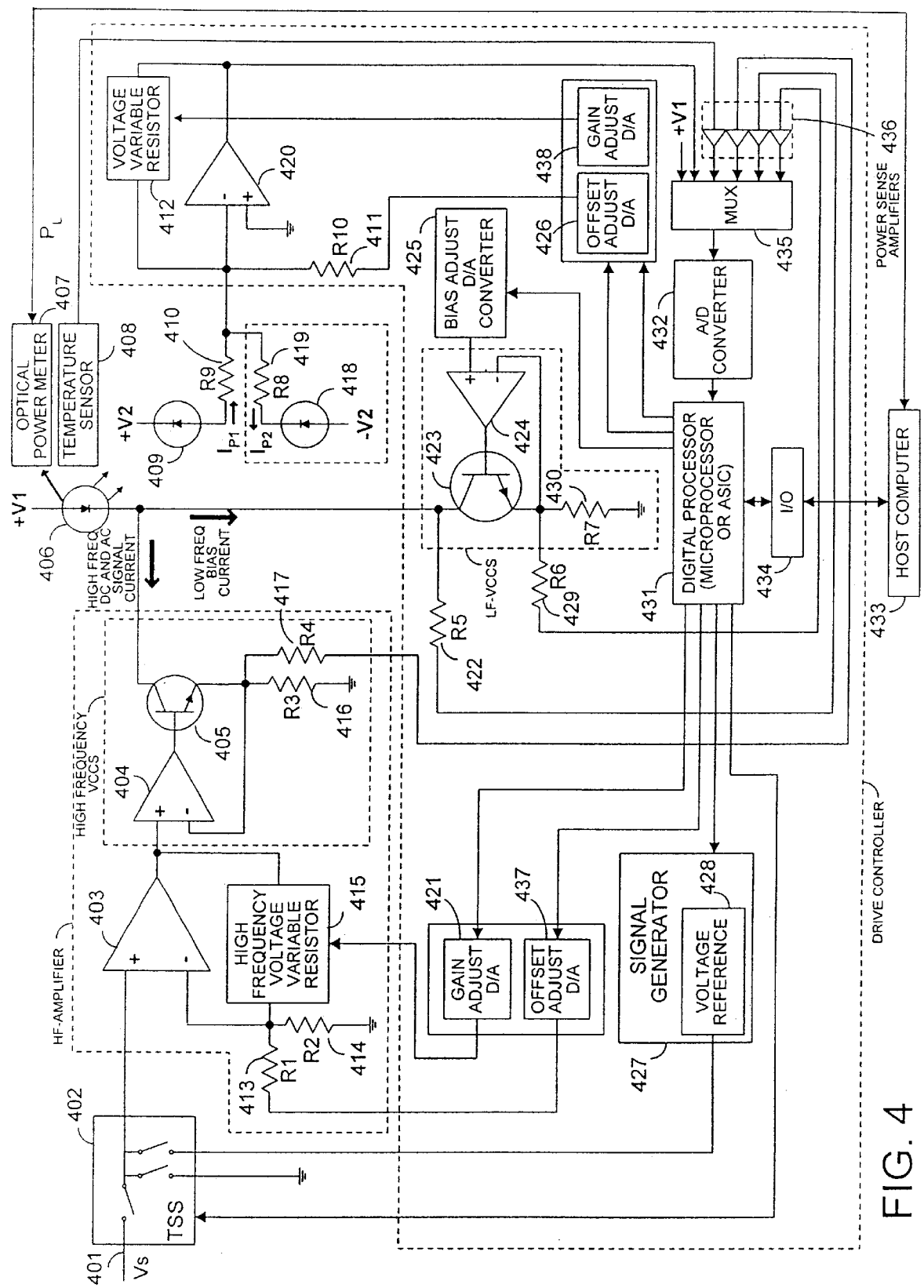
FIG. 4 illustrates a second embodiment of the electro-optic system controller in accordance with t present invention.

Drawing references are to FIGS. 4 and 9.

1. For the first step, connect system to a PC or another instrument used for calibration. This connection can be made with any suitable I/O such as an USB interface. Also, connect an optical power meter (OPM) to the output of the laser.
2. Set preamplifier gain to nominal. The signal preamplifier will normally have a given amount of offset voltage. This offset voltage will translate into an offset current being applied by the High Frequency Voltage Controlled Current Source (HF-VCCS) 404, 405, 416, 417. This current will be a DC current and will add to the DC bias current. For the purposes of calibrating the DC bias of the laser, the DC bias caused by the offset will be nulled out. The gain of the preamplifier is set to nominal in order to amplify the offset by the amount expected during normal operation. Any drift of the offset with temperature or with a minor change of gain can be accounted for in the DC bias margin setting.
3. Connect input of preamplifier to the circuit common. Using the Test System Switch (TSS) 402, we connect zero volts to the preamplifier in order to not apply current from the signal path to the laser.
4. Turn off DC bias for laser. This is needed since we want no light emission from the laser so we can measure dark current in the photodiode.
5. To null the offset of the preamplifier the system needs to add an offset current to the minus input of amplifier 403. Utilizing D/A converters or PWM devices it is possible to set an appropriate voltage value to be applied to the high frequency gain attenuator 415. This procedure will set the gain of the high frequency preamplifier. Example of high frequency gain attenuator is AMP-MACOM AT65-0107 or AT-309. These types of devices will operate from DC to several GHz. Change the offset D/A 437 until the offset of the high frequency preamplifier is zero (as determined by zero volts measured with high impedance meter across $R_1$).
6. Read and record dark current from photodiode. Photodiode dark current compensation.

Figure 5:
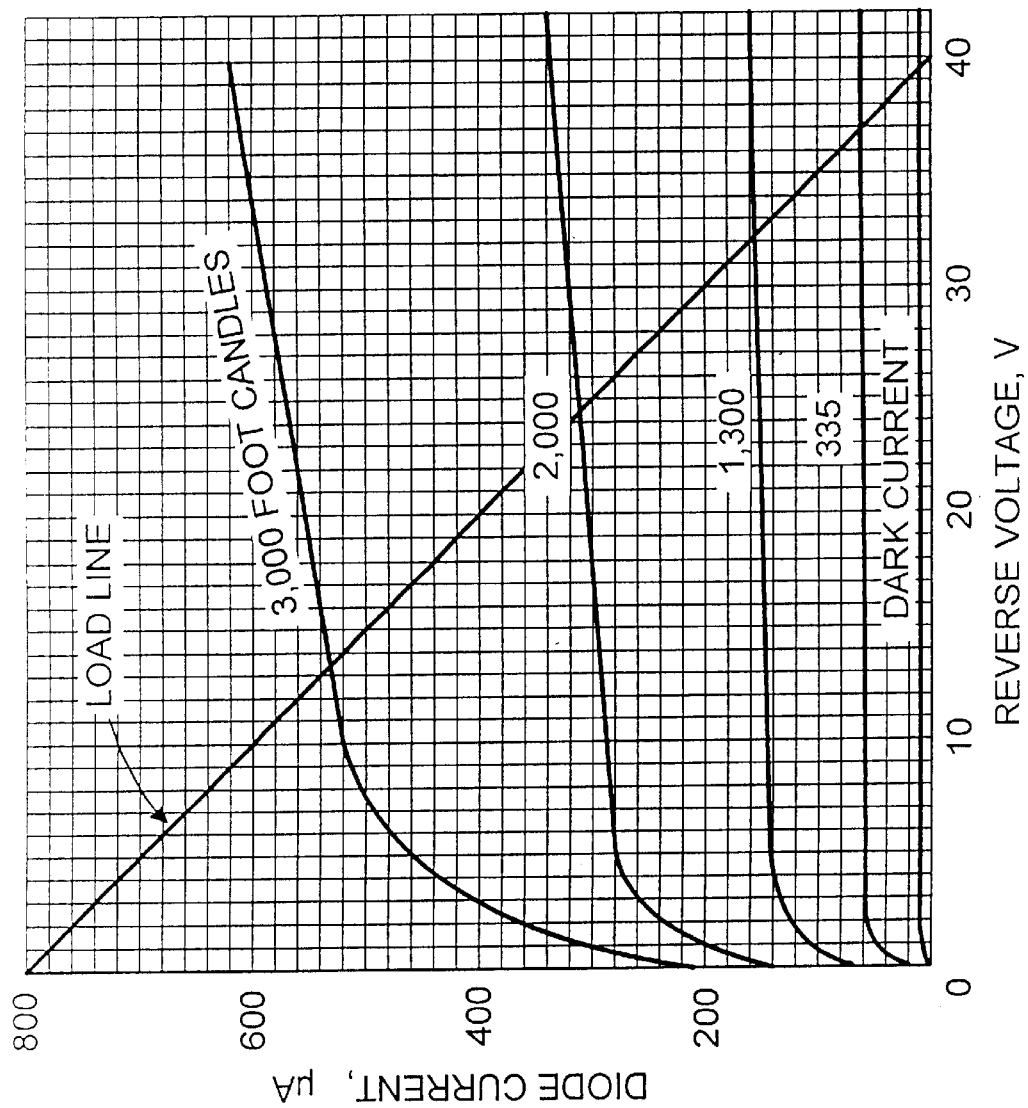
FIG. 5 illustrates the volt-ampere characteristics for an exemplary germanium photodiode in accordance with the present invention.

FIG. 5 shows the volt-ampere characteristics for a germanium photodiode. They are clearly nonlinear for reverse voltages below 10 volts.

The photodiode current is given by $$I = I_s + I_o(1 - e^{V/nV_T}) \qquad \text{Eq. (1)}$$

where

I, $I_s$ and $I_o$ represent the magnitude of the reverse current, V is negative for a reverse bias, n varies depending on the material used in the process and $V_T$ is the volt equivalent of temperature. $V_T$=T/11,600, T is in degrees Kelvin. $I_o$ is the reverse saturation current. This current is also known as dark current. The current as shown, is highly dependent on temperature. Additional leakage over the surface of the device contributes to this current beyond what the formula shows. Additional experimental data places the temperature drift of the reverse saturation current at 7% per degree C.

$I_s$ is the short circuit current proportional to the light intensity. The characteristics will drift somewhat with photodiode age.

There are many other types of photodiodes and photodetectors. For example some systems utilize avalanche photodiodes. These other devices will exhibit similar issues in terms of temperature drift and aging and can also be described by equations which allows calibration to be done in a similar manner to what is shown in this embodiment.

For example, the monitor photodiode used with the Mitsubishi MLXX2 series laser diode has a dark current of $0.5_\mu$A at 25° C. At 55° C., the dark current will be $(0.5_\mu A)(1.07)^{30}=0.5_\mu A(7.612)=3.806_\mu A$. For a laser output of 3 mW, the photodiode current is specified to be as little as $150_\mu$A. The dark current is then ~2.5% of the output. Generally, errors of no more than a fraction of a percent are allowed in order to allocate error budget for the other areas of the control system. This discussion demonstrates the need to account for the dark current. A laser Drive Controller which utilizes a photodiode to monitor and control a laser needs to account for the dark current in order to avoid significant errors due to temperature drift and aging of the photodiode.

FIG. 4 shows a second embodiment of the drive controller in accordance with the invention. In this embodiment, the amplifier 420 includes a resistor 412 with an operational amplifier 420 where two matching photodiodes 409, 418 are connected. The amplifier is a precision amplifier with low bias currents and with a current to voltage conversion gain determined by the magnitude of $R_f$ (resistor 412).

$$I_o = I_{p1} - I_{p2} = I_s + I_o(1 - e^{V/nVT}) - I_o(1 - e^{V/nVT}) = I_s \qquad \text{Eq. (2)}$$

In this manner, one of the branches to the summing junction subtracts the dark current. The only current remaining is the current Is due to the current due to the light intensity. A common problem in photodetection is the nonlinearity of devices used. An important feature of the circuit is the low value of resistance R (410 or 419). This causes the load line shown in FIG. 5 to be very steep which allows operation in the area where the current Is is linear due to the light intensity.

After the circuit described above has conditioned the photodiode output, the signal is then ready for analog to digital conversion. Note that it is also possible to utilize only one photodetector and simply subtract the dark current after the analog to digital conversion.

Steps 7,8 are done in order to perform calibration of photodiode current at laser threshold and to set the laser current threshold during calibration. The measurement utilizes a light power meter instrument connected to the transceiver undergoing calibration. FIG. 6 explains the various parameters utilized for the calibration.

The process is as follows: By changing the duty cycle of a pulse width modulator (PWM) (425), or changing the count of a D/A converter (425), apply a voltage to a precision voltage controlled current source VCCS (423, 424, 430) in order to increment the bias current of the laser diode. Manufacturers recommend laser bias currents to be incremented gradually in order to avoid any overcurrent switching of the laser. This is because the laser characteristic changes drastically with temperature and it is not known how much power output will result with a given laser current. Every time the laser current is incremented, the laser power is determined as given by the external calibration instrument. By computing $dP_L/dI_L$ (derivative of laser power with respect to laser current) it is possible to know if the laser has filly transitioned in its characteristic from the region of spontaneous emission, to the region of stimulated emission. The transition is known to occur when the derivative reaches a maximum constant value.

It is possible to identify that the system is operating in the region of stimulated emission only after the laser current has gone past the threshold. For that reason, in the hardware implementation, the laser current will increment beyond the threshold and the system will need to gradually decrease the current until a change in the derivative is detected again. At this point the system reads and records the laser threshold current value $I_{LTH}$. Any further changes in the threshold current due to a change in temperature can be treated as a system offset.

9. Read and record the laser threshold power $P_{LT}$ from the external instrument.
10. With the use of an A/D converter, read the photodiode current under the conditions set and subtract the dark current (if the system utilized does not use the dark current compensation circuit discussed earlier in step 5). We then obtain a calibrated value for the photodiode current $I_{PTH}$ (FIG. 6B) at the laser threshold.
11. Measure and record the temperature of the laser case, and then determine, with the model, the temperature of the laser.
12. Using the TSS 402, disconnect the preamplifier input from the circuit common and connect preamplifier input to $V_{REF}$, Voltage reference 428.

Figures 7A, 7B:
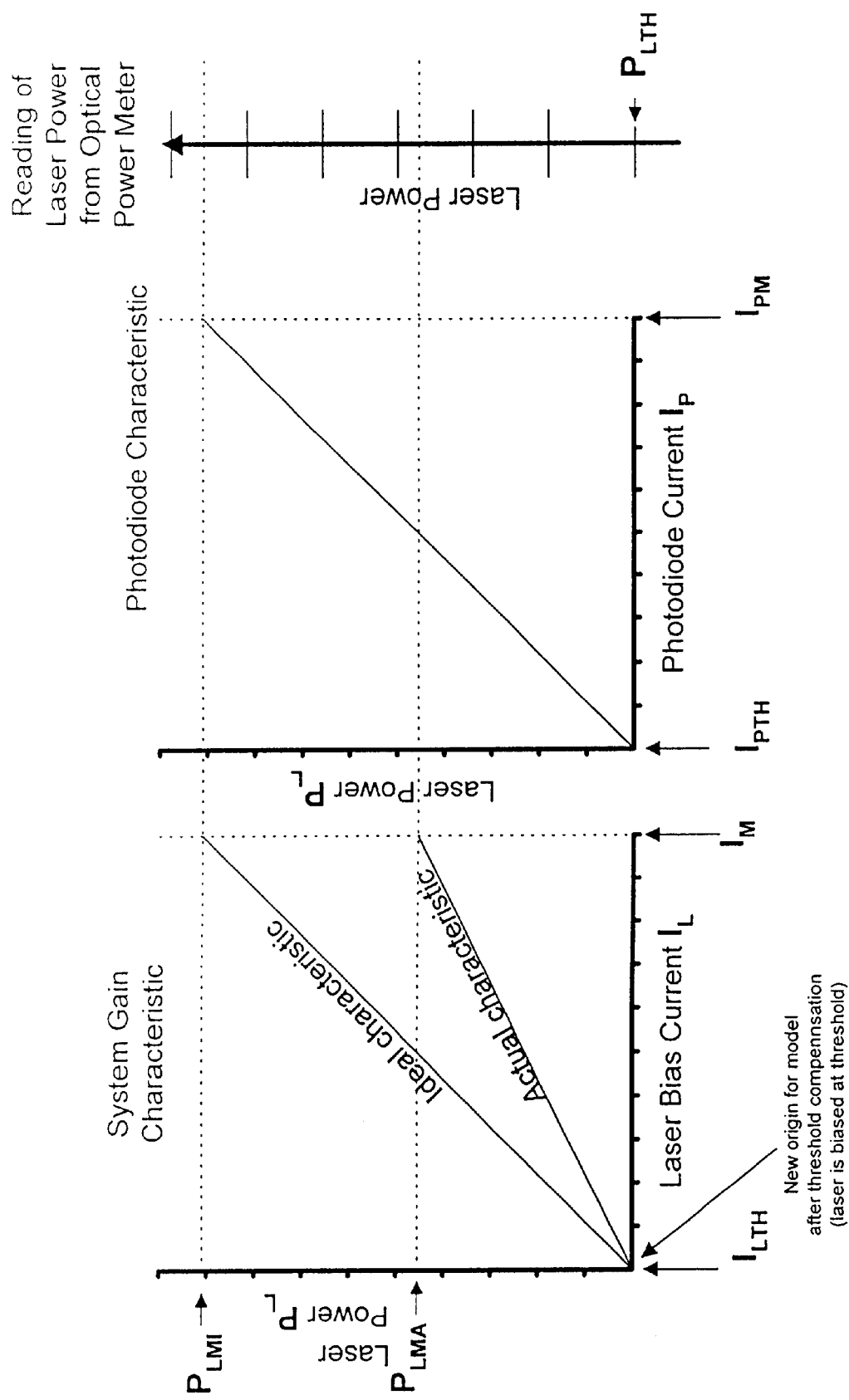
FIGS. 7A and 7B illustrate the laser and photodiode characteristics, respectively, in accordance with the present invention.

As can be seen in FIG. 7, errors in gain of the preamplifier as well as errors in the slope efficiency of the laser will cause the actual overall system gain to be different. The line labeled "actual characteristic" shows a different slope, representing the difference in gain from ideal. As can be seen from FIG. 7, the overall actual transmitter gain characteristic will be different from the gain represented by the "ideal characteristic". Note that the system gain is a multiplier to the input signal and is not related to the DC bias of the laser. The DC bias is shown as an offset that translates the origin of our coordinate system to the threshold. The way to determine gain is to determine what the system does to an input signal.

Step 13

The gain G of the transmitter system is then changed in order to account for the deviation described above. While applying a nominal full-scale voltage to the system $V_{REF}$, we produce a voltage at the output of the preamplifier of $V_{REF}G_1$, where $G_1$ is the gain of the preamplifier. This produces a laser current of $V_{REF}G_1/R_1$ and a laser optical power output of:

$$P_{LMA} = V_{REF}G_1G_{LA}/R_1,$$

where $G_{LA}$ is the gain of the laser transfer characteristic (a.k.a. slope efficiency).

Figure 8:
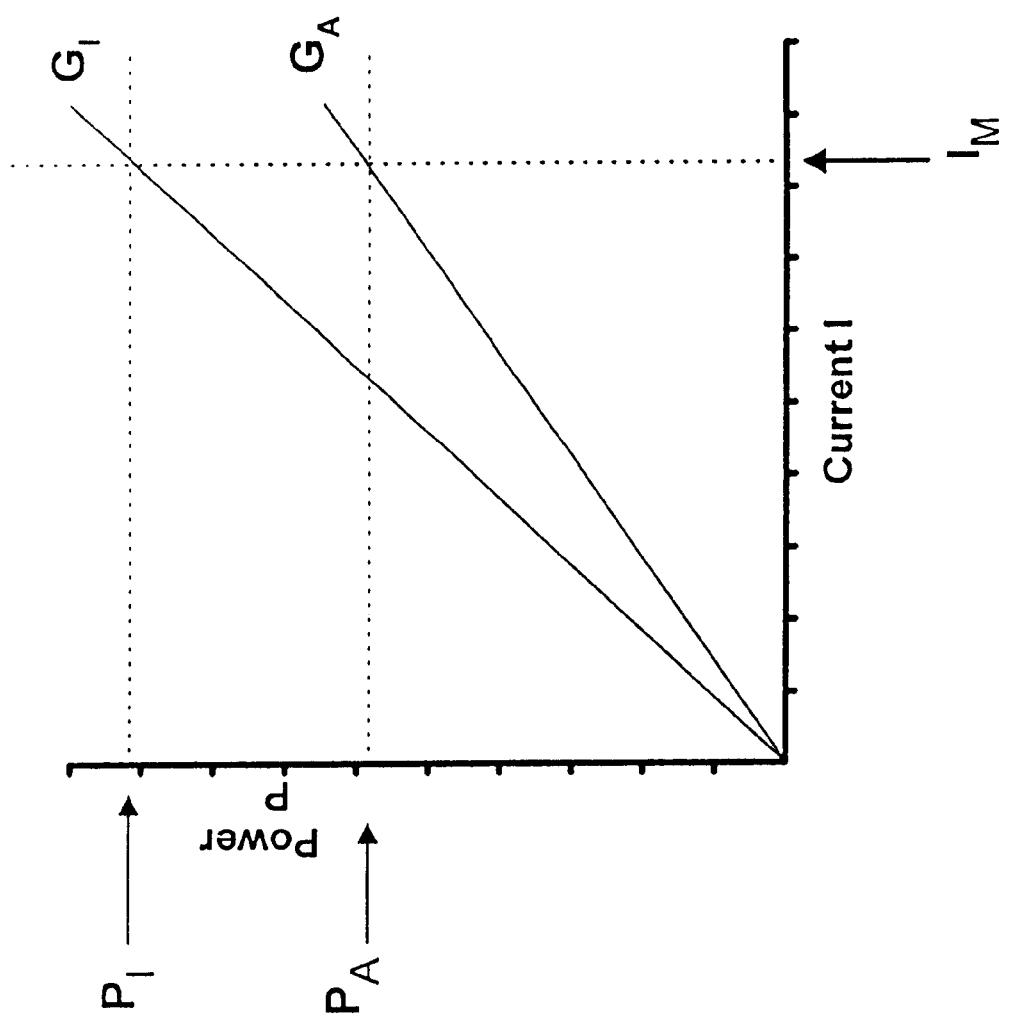
FIG. 8 illustrates the laser transfer characteristic in accordance with one embodiment oft present invention.

The laser transfer characteristic differs from the ideal value. It will exhibit an actual gain $G_{LA}$, which is different from the nominal or ideal gain $G_{LI}$. At this point in the process we record the value of $I_M$ and the value of the $P_{LMA}$ as measured with the instrument. Note that we can determine the value of $I_M$ with precision since we are using a high resolution D/A to control the gain of the amplifier, a precision reference voltage and a VCCS signal driver for the laser. For a given laser current $I_M$ we get different readings of power, depending on the slope of the laser characteristic. It is possible to have the nominal characteristic with the ideal gain slope or the actual characteristic exhibiting an error in the slope. FIG. 8 illustrates this situation.

In this case, the values obtained for the power are:

$$P_{LMA} = G_{LA}I_M \text{ and } P_{LMI} = G_{LI}I_M$$

Solving for the nominal value of power in terms of the other parameters we get:

$$P_{LMI} = G_{LI}(P_{LMA}/G_{LA}) = (G_{LI}/G_{LA})P_{LMA} = (G_{LI}/G_{LA}) G_{LA}I_M = G_{LA}(G_{LI}/G_{LA})I_M \qquad \text{Eq. 3:}$$

This says that increasing the gain of the signal by the ratio of the slopes we can obtain the corrected gain of the system. It also says that the operation is equivalent to multiplying the laser current $I_X$ by the ratio of the two slopes and driving the laser with the higher current.

In the case of our reference calibration input we have:

$$P_{LMI} = G_{LA}(G_{LI}/G_{LA})(V_{REF}G_1/R_1) \qquad \text{Eq. 4:}$$

By transposing terms we obtain, $$P_{LMI} = (G_1(G_{LI}/G_{LA}))(V_{REF}/R_1)G_{LA} \qquad \text{Eq. 5:}$$

Equation 5 says that if we increment the gain of the preamplifier by the factor $G_{LI}/G_{LA}$ we will have compensated for the error of the laser slope. The model shows that there is no need to utilize a costly specialized circuit such as a multiplier to compensate for the error in the slope efficiency of the laser since the preamplifier driver can take care of the gain compensation. For high frequency applications, the advantage is that we only need one high frequency part, namely, the high frequency amplifier and we do not need a multiplier. Also, the model illustrated in FIG. 8 can include any errors in the preamplifier and as a consequence, the model also compensates for gain in the preamplifier. Any time we apply a signal on the high frequency path, it will automatically be incremented so as to produce a corresponding laser current free of gain errors.

In the actual factory calibration no multiplication is carried out. While applying the reference voltage VREF, we simply increment the PWM or D/A (421) which controls the programmable gain resistor 415 of the preamplifier until the desired reading of the output power is read on the calibration instrument (step 14). Note that to obtain laser current needed for full scale as determined above, we need to maintain the threshold current on the DC bias path.

15. Determine the corresponding photodiode current $I_{PM}$ needed for a full-scale power output. This is done by making a measurement of the photodiode current with the A/D converter and with the cancellation of the dark current.
16. Calculate the effective responsivity $R_{eff}$ of the module containing the laser and the photodiode and store in memory.

$$R_{eff}=(P_{LMf}-P_{LT})/(I_{PM}-I_{PTH}). \text{ The units are in A/W} \qquad \text{Eq. 6:}$$

17. Calculate and store slope efficiency equation at ambient.

$$G_{LA}=P_{LMA}/I_M \qquad \text{Eq. 7:}$$

Enter all parameters needed for drift compensation equations. These parameters are previously obtained from the characterization of the laser system. The equations are:

Threshold compensation formula $$I_L=I_{LTH}+D_{TH}(T)\Delta T, \text{ where } I_L=\text{new laser DC bias}, \qquad \text{Eq. 8:}$$

$D_{TH}$ (T) is a function of temperature representing the temperature drift coefficient of the bias current in units of mA/deg C., the drift coefficient is the best suited approximation to the drift behavior of the laser, it can be a polynomial, a constant or a set of data points stored in the Drive Controller.

Gain compensation formula, $$G_2=G_1+G_1D_G(T)\Delta T \qquad \text{Eq. 9:}$$

where $G_2$=new amplifier gain, $D_G$ (T) is a function of temperature representing the temperature drift coefficient of the laser and amplifier gain in units of mW/mA/deg C., the drift coefficient is the best suited approximation to the drift behavior of the amplifier and laser. The compensation is a polynomial, a constant or a set of data points stored in the Drive Controller.

Compute system parameters; store them in the Drive Controller. Also store the parameters related to the thermal model. Disconnect calibration instrument and PC.

Power up Calibration and Initialization

Figure 10:
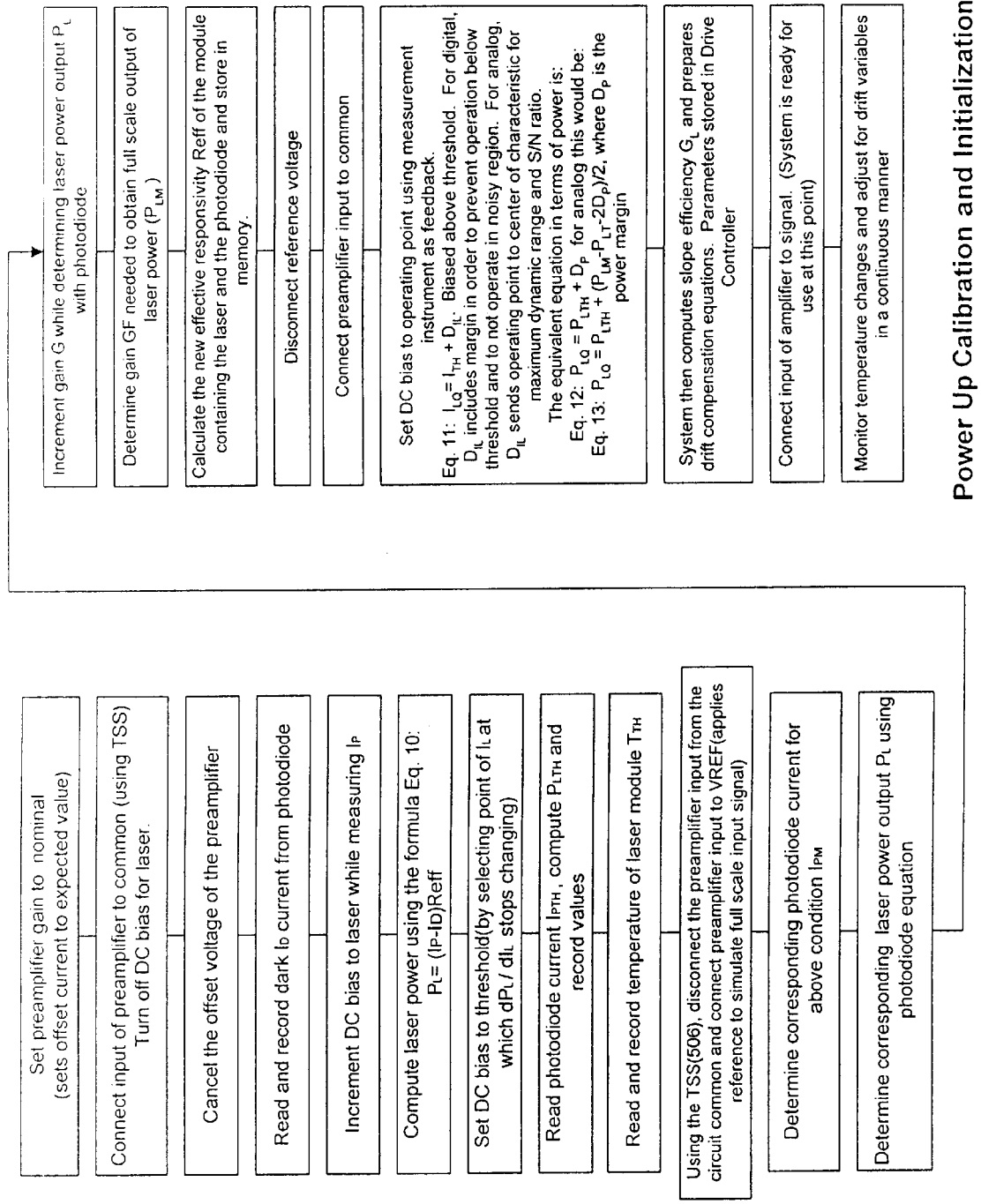
FIG. 10 illustrates one embodiment of the power up calibration and initialization process in accordance with one embodiment of the present invention.

FIG. 10 illustrates one embodiment of the power up calibration and initialization process in accordance with one embodiment of the present invention. During normal power up, the control system utilizes the calibrated photodiode equations for determining laser power feedback. The procedures are similar to the procedures used in the factory calibration.

1. Set preamplifier gain to nominal(sets offset current to expected value)
2. Connect input of preamplifier to common (using TSS)
3. Turn off DC bias for laser
4. Cancel the offset voltage of the preamplifier
5. Read and record dark $I_D$ current from photodiode
6. Increment DC bias to laser while measuring $I_P$
7. Compute laser power using the formula $$P_L=(I_P-I_D)R_{eff} \qquad \text{Eq. 10:}$$

8. Set DC bias to threshold(by selecting point of $I_L$ at which $dP_L/dI_L$ stops changing)
9. Read photodiode current $I_{PTH}$, compute $P_{LTH}$ and record values
10. Read and record temperature of laser module $T_{TH}$
11. Using the TSS(506), disconnect the preamplifier input from the circuit common and connect preamplifier input to $V_{REF}$(applies reference to simulate full scale input signal)
12. Determine corresponding photodiode current for above condition $I_{PM}$
13. Determine corresponding laser power output $P_L$ using photodiode equation
14. Increment gain G while determining laser power output $P_L$ with photodiode
15. Determine gain $G_F$ needed to obtain full scale output of laser power ($P_{LM}$)
16. Calculate the new effective responsivity $R_{eff}$ of the module containing the laser and the photodiode and store in memory.
17. Disconnect reference voltage
18. Connect preamplifier input to common
19. Set DC bias to operating point using measurement instrument as feedback.

$$I_{LQ}=I_{TH}+\Delta_{IL}. \qquad \text{Eq. 11:}$$

Biased above threshold. For digital, $\Delta_{IL}$ includes margin in order to prevent operation below threshold and to not operate in noisy region. For analog, $\Delta_{IL}$ sends operating point to center of characteristic for maximum dynamic range and S/N ratio.

The equivalent equation in terms of power is:

$$P_{LQ}P_{LTH}+\Delta P \qquad \text{Eq. 12:}$$

for analog this would be:

$$P_{LQ}=P_{LTH}+(P_{LM}-P_{LT}-2\Delta P)/2, \qquad \text{Eq. 13:}$$

where $\Delta P$ is the power margin
20. System then computes slope efficiency $G_L$ and prepares drift compensation equations (see below). Parameters stored in Drive Controller
21. Connect input of amplifier to signal. (System is ready for use at this point)
22. Monitor temperature changes and adjust for drift variables in a continuous manner Drift Compensation After power up factory calibration is completed, the system continuously monitors temperature for any changes that require re-adjustment of DC bias or system gain. Adjustment is made as necessary utilizing model and fine steps that emulate analog drift. There are several types of drift compensation as described below:

Laser Threshold Drift Compensation

Formula is:

$$I_L=I_{LTH}+D_{TH}(T)\Delta T, \text{ where } I_L=\text{new laser } DC \text{ bias}, \qquad \text{Eq. 14:}$$

$D_{TH}$ (T) is a function of temperature representing the temperature drift coefficient of the bias current in units of mnA/deg C., the drift coefficient is the best suited approximation to the drift behavior of the laser, it can be a polynomial, a constant or a set of data points stored in the Drive Controller.

If we use a 12 bit D/A converter with a 5V reference voltage to change the laser bias current, we have a resolution of $\Delta V=5V/2^{12}=1.22$ mV/count If the VCCS uses a 10Ω resistor, we have a resolution of $\Delta I=\Delta V/10\Omega=0.122$ mA/count. This circuit can be done with a D/A converter such as the DAC1218 made by National Semiconductor.

In the case of the ML3XX1 laser made by Mitsubishi, the drift of the threshold current is specified as 0.317 mA/°C. This means that in order to adjust, we need to change the D/A by ~3 counts. If the specific implementation requires higher adjustment accuracy, for higher resolution, it is possible to utilize a smaller reference voltage for the D/A. However, this approach will be limited by the intrinsic errors of the device such as differential non-linearity.

In that case it is possible to use a 16 bit D/A converter with a 5V reference. This will yield a resolution of $\Delta V=5V/2^{16}=76.29$ μV/count If the VCCS uses a 100Ω resistor, we have a resolution of $\Delta I=\Delta V/100\Omega=0.763$ μA/count. Because the current adjustment capability is of such high resolution, this calculation demonstrates the principle in the invention which is that we can continually adjust the current in a way that simulates analog drift without taking the laser system out of operation.

Gain Drift of Amplifier and Laser

Formula is $$G_2 = G_1 + G_1 D_{GIGL}(T)\Delta T \qquad \text{Eq. 15:}$$

where $G_2$=new amplifier gain, $D_{GIGL}$(T) is a function of temperature representing the temperature drift coefficient of the laser and amplifier gain in units of mW/mA/deg C., the drift coefficient is the best suited approximation to the drift behavior of the amplifier and laser. It can be a polynomial, a constant or a set of data points stored in the Drive Controller. In the case of the ML2XX1 laser made by Mitsubishi, the drift of the laser gain(slope efficiency) is specified as −0.0028 mW/mA/°C.

An equation represents the laser temperature in terms of the characteristic thermal resistances of the mechanical system that comprises the laser module. An example of this equation is $$T_J = T_S + P_L(\theta_{JC} + \theta_{CSH} + \theta_{HS}), \qquad \text{Eq. 16:}$$

where $T_J$ is the laser junction temperature, $T_S$ is the sensor temperature, $P_L$ is the laser power, $\theta_{JC}$ is the laser junction to laser case thermal resistivity, $\theta_{CSH}$ is the thermal resistivity of the laser case to the laser module holder/heat sink, $\theta_{HS}$ is the thermal resistivity from the heat sink to the sensor.

A method for determining laser thermal resistance given by Mitsubishi in "Optical Semiconductor Devices and Optical Fiber Communication Systems" data book. Other more complex thermal arrangements for mechanical systems involving the laser can be modeled in a similar manner with more complex thermal circuit models. These models are then characterized for a given design to determine the values of the parameters (See Engineering Thermodynamics by Reynolds and Perkins, Mc Graw Hill)

Photodiode Effective Responsivity Drift

Although in many applications the photodiode drift can be neglected, in some cases there may need to be a correction for the drift of the effective responsivity of the photodiode.

$$R_{eff} = R_{eff} + D_{Reff}(T)\Delta T \qquad \text{Eq. 17:}$$

$D_{Reff}$(T) is a function representing the drift as a function of temperature.

The Laser Equations $I_L$=DC threshold+threshold drift compensation+Q point current+signal current with drift compensation $$I_L = (I_{LTH} + D_{LTH}(T) + \Delta I_{LDC} + (G_1 + D_{GIGL}(T)\Delta T) V_S/R \qquad \text{Eq. 18:}$$

Photodiode Drift Equations

The photodiode equations $$R_{eff} T = R_{eff} + D_{Reff}(T)\Delta T \qquad \text{Eq. 19:}$$

The present invention has been described with reference to specific embodiments. Other embodiments will be apparent to those skilled in the art in view of the foregoing description. It is therefore intended that this invention not be limited except as indicated by the appended claims:

What is claimed is:

1. An electro-optic drive control system having a preamplifier output coupled to a laser module system input, the laser module system having a laser bias input, a laser output, a temperature sensor output, and a monitoring photodiode sensor output, a method for calibrating the laser module system, comprising:

connecting testing equipment used for laser calibration to the laser output;

setting preamplifier gain to nominal;

connecting input of preamplifier to ground;

turning off the DC bias for laser;

canceling the offset voltage of the preamplifier;

recording the monitoring photodiode dark current;

incrementing the DC bias to the laser;

reading $P_L$;

computing $dP_L/dI_L$;

setting the DC bias to threshold;

recording $P_{LTH}$;

recording the photodiode current $I_{PT}$;

recording the temperature of laser module;

connecting the preamplifier to provide a $V_{REF}$ input signal to the laser module input;

incrementing preamplifier gain $G_1$ while reading power output $P_L$ with instrument;

determining the preamplifier gain $G_F$ needed to obtain full scale output of laser power ($P_{LM}$);

determining the corresponding photodiode current for above condition $I_{PM}$;

calculating the effective responsivity $R_{eff}$ of the module containing the laser and the photodiode; and storing the effective module responsivity $R_{eff}$ in memory.

* * * * *